United States Patent
Suzuki et al.

(10) Patent No.: US 6,243,946 B1
(45) Date of Patent: *Jun. 12, 2001

(54) METHOD OF FORMING AN INTERLAYER CONNECTION STRUCTURE

(75) Inventors: Etsuji Suzuki, Yokohama; Akira Yonezawa, Tokyo; Hidehisa Yamazaki, Okayama-ken, all of (JP)

(73) Assignee: Yamaichi Electronics Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/843,057

(22) Filed: Apr. 11, 1997

(30) Foreign Application Priority Data

Apr. 12, 1996 (JP) .................................... 8-091417

(51) Int. Cl.⁷ ................... H05K 3/02; H05K 3/10
(52) U.S. Cl. ................... 29/846; 29/825; 29/829; 29/844; 29/847; 156/51; 156/52; 156/53
(58) Field of Search .................. 174/255, 261, 174/259, 264, 256, 250; 361/792, 793, 794, 795, 750, 774, 776, 777, 778, 779; 439/91, 591; 29/848, 852, 825, 829, 830, 831, 842, 844, 846, 847; 156/50, 52, 51, 53

(56) References Cited

U.S. PATENT DOCUMENTS

| | | | |
|---|---|---|---|
| 3,683,105 | * 8/1972 | Shamash et al. | 174/68.5 |
| 4,354,311 | 10/1982 | Neuhoff et al. | 29/840 |
| 4,382,236 | 5/1983 | Suzuki | 333/1 |
| 4,435,740 | * 3/1984 | Hucka Bee et al. | 361/749 |
| 4,467,638 | 8/1984 | Greenstein | 73/64.48 |
| 4,554,033 | * 11/1985 | Dery et al. | 156/52 |
| 4,588,456 | 5/1986 | Dery et al. | 156/52 |
| 4,640,981 | * 2/1987 | Dery et al. | 174/88 R |
| 4,642,421 | 2/1987 | Dery et al. | 174/88 R |
| 4,779,340 | * 10/1988 | Kihm et al. | 29/847 |
| 5,187,020 | * 2/1993 | Kwon et al. | 428/601 |
| 5,203,075 | * 4/1993 | Angulas et al. | 29/830 |
| 5,421,081 | * 6/1995 | Sakaguchi et al. | 29/840 |
| 5,436,411 | * 7/1995 | Pasch | 174/261 |
| 5,473,120 | * 12/1995 | Ito et al. | 174/264 |
| 5,502,889 | 4/1996 | Casson et al. | 29/830 |
| 5,528,151 | 6/1996 | Perez | 342/525 |
| 5,598,139 | 1/1997 | Karim et al. | 340/286.11 |
| 5,662,987 | * 9/1997 | Mizumoto et al. | 428/209 |
| 5,688,584 | * 11/1997 | Casson et al. | 428/209 |
| 5,699,613 | * 12/1997 | Chong et al. | 29/852 |
| 5,800,650 | * 9/1998 | Anderson et al. | 156/150 |

* cited by examiner

Primary Examiner—Michael O'Neill
Assistant Examiner—Binh-An Nguyen
(74) Attorney, Agent, or Firm—Wenderoth, Lind & Ponack L.L.P.

(57) ABSTRACT

An interlayer connection structure in a circuit board characterized in that a local part of a conductive circuit layer disposed at one surface side of an insulative sheet is bent inwardly of the insulative sheet so that an apex of a projectingly bent portion is formed, and the apex of the projectingly bent portion is abutted with another conductive circuit layer disposed at the other surface side of the insulative sheet so that an interlayer connection is established therebetween.

14 Claims, 8 Drawing Sheets

METHOD OF FORMING AN INTERLAYER CONNECTION STRUCTURE

BACKGROUND OF THE INVENTION

1. Field of the Invention

This invention relates to an interlayer connection structure between conductive circuit layers disposed at one and the other surface sides of a circuit board.

2. Brief Description of the Related Art

Recently, electronic instruments have developed remarkably and electronic instruments of high degree of precision have been used in various fields. With the progress of this development, circuit boards to be used in such electronic instruments are required to have a high performance and a high efficiency. At the same time, such electronic instruments are required to be inexpensive.

As a circuit board, a rigid multilayer circuit board, flexible multilayer circuit board and a rigid/flexible multilayer circuit board as a combination thereof are mostly used. In such a multilayer circuit board, an interlayer connection is required. In order words, conductive circuits of the multilayer circuit board are required to be electrically connected together at predetermined spots.

FIG. 1 shows a process for an interlayer connection by a through-hole plating method which is most generally practiced. According to this method, as shown in FIG. 1A, a double face copper clad lamination substrate composed by joining copper foils 1, 2 to opposite surfaces of an insulative sheet 3 is formed. Then, as shown in FIG. 1B, a part of this double face clad lamination substrate corresponding to a conductive circuit is drilled, for example, to form a hole therein. Thereafter, as shown in FIG. 1C, a copper plating 5 is applied to an inner wall surface of a drilled hole 5. At this time, the copper plating 5 is applied also to the surfaces of the copper foils, 1, 2 on the opposite surfaces of the insulative sheet 3. Then, as shown in FIG. ID, a pattern is formed on each copper foil 1, 2 by an ordinary photoetching process, so that conductive circuit layers 1', 2' are formed. This example is a method for manufacturing a double face circuit board The same is likewise applicable to a multilayer circuit board which is subjected to the drilling process and the copper plating process in which the above-mentioned drilling and copper plating processes are employed.

In such prior art devices as mentioned above, several thousands of holes free from burrs must be formed in the conductive circuit. Moreover, in some cases, a surface processing (smearing processing) must be performed with respect to the surface of the wall of each hole.

That is, because a large number of processing steps are required for the interlayer connection, those steps result in major factors for increasing costs. Moreover, because there is a provision of holes formed in the surface of the board, electrical parts can not be mounted thereon. This makes it difficult to mount such electrical parts in high density.

The present invention has been accomplished in view of the above-mentioned problems inherent in the prior art devices.

SUMMARY OF THE INVENTION

It is, therefore, an object of the present invention to provide an interlayer connection structure in a circuit board in which an interlayer connection can be made in a simple manner.

Another object of the present invention is to provide an interlayer connection structure in a circuit board which can be reduced in manufacturing cost.

A further object of the present invention is to provide an interlayer connection structure in a circuit board which can effectively fulfill the requirement for designing circuit pattern in high density.

A still further object of the present invention is to provide an interlayer connection structure in a circuit board in which electronic parts can be mounted in high density.

In order to achieve the above objects, there is essentially provided an interlayer connection structure in a circuit board characterized in that a local part of a conductive circuit layer disposed at one surface side of an insulative sheet is bent inwardly of the insulative sheet so that an apex of a projectingly bent portion is formed, and the apex of the projectingly bent portion is abutted with another conductive circuit layer disposed at the other surface side of the insulative sheet so that an interlayer connection is established therebetween.

From another aspect of the present invention, there is also provided an interlayer connection structure in a circuit board characterized in that a local part of a conductive circuit layer disposed at one surface side of an insulative sheet and a local part of another conductive circuit layer disposed at the other surface side are bent inwardly of the insulative sheet so that an apex of each projectingly bent portion is formed, and the apexes of the projectingly bent portions are abutted with each other so that an interlayer connection is established therebetween.

It is preferred that the apexes of the projectingly bent portions are fused together by means of a conductive paste or a metal having a low melting point, which is interposed between interfaces of the abutting portions.

The insulative sheet may be a thermoplastic resin, and the projectingly bent portion may be projected inside while the insulative sheet is locally plasticized.

The thermoplastic resin may be a liquid crystal polymer.

The above and other objects and attendant advantages of the present invention will become manifest to those skilled in the art from a reading of the following description and claims in conjunction with the accompanying drawings which constitute part of this specification.

BRIEF DESCRIPTION OF THE DRAWNGS

Figure 6A:
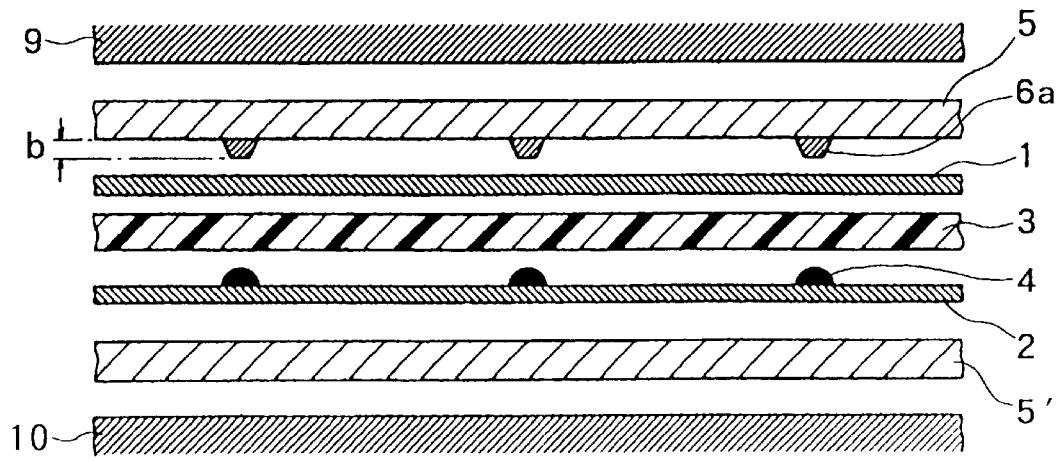
Figure 6A:
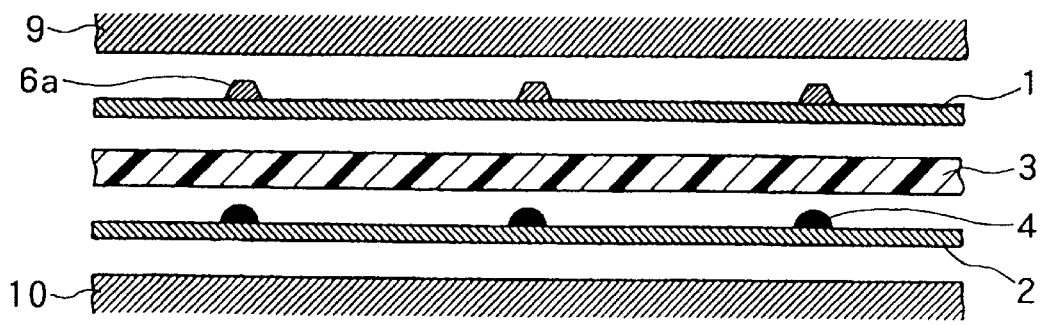
Figure 7A:
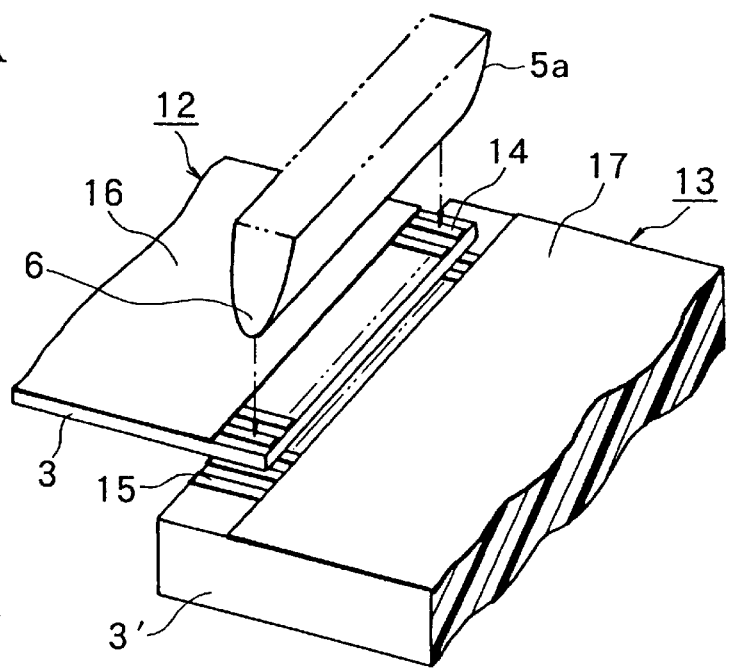
Figure 7B:
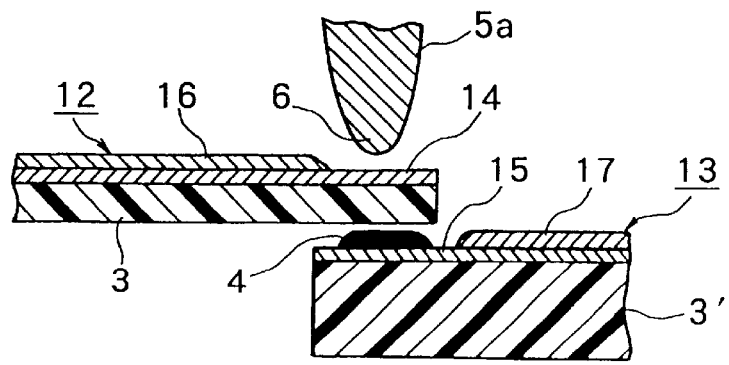
Figure 7C:
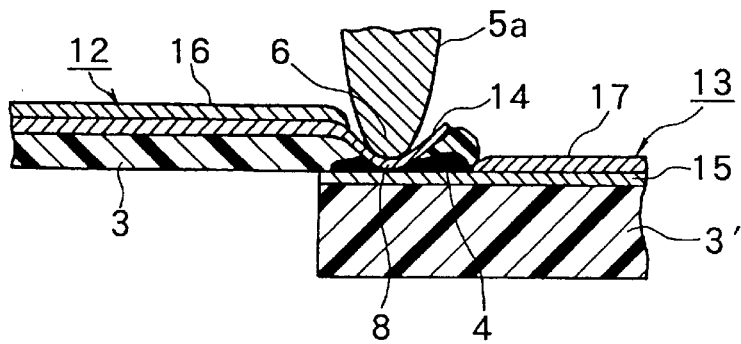
Figure 8A:
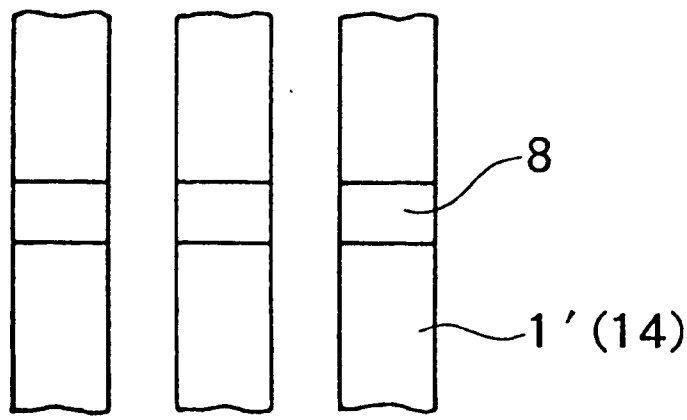
Figure 8B:
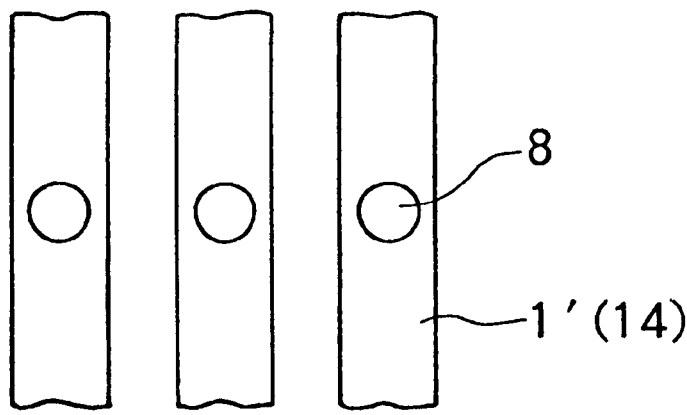

FIGS. 6A, 6A' through 6C are sectional views exemplifying an interlayer connection structure in a circuit board according to the present invention by way of its fifth manufacturing process;

FIGS. 7A through 7C are sectional views exemplifying an interlayer connection structure in a circuit board according to the present invention by way of its sixth manufacturing process; and FIGS. 8A and 8B are plan views showing examples for forming a projectingly bent portion in each of the above-mentioned embodiments.

DETAILED DESCRIPTION OF THE EMBODIMENTS

FIG. 2 is an explanatory view showing the present invention by way of manufacturing process of a double surface flexible circuit board. As shown in FIG. 2A, copper foils 1, 2 are thermally bonded under pressure to one and the other surface of a flexible insulative sheet 3 made of a thermoplastic resin material to thereby form a double surface copper clad lamination substrate. A bonding surface of the copper foil 2 or 1 is provided at predetermined positions thereof with an appropriate quantity of conductive pastes 4 by printing.

Figure 2A:
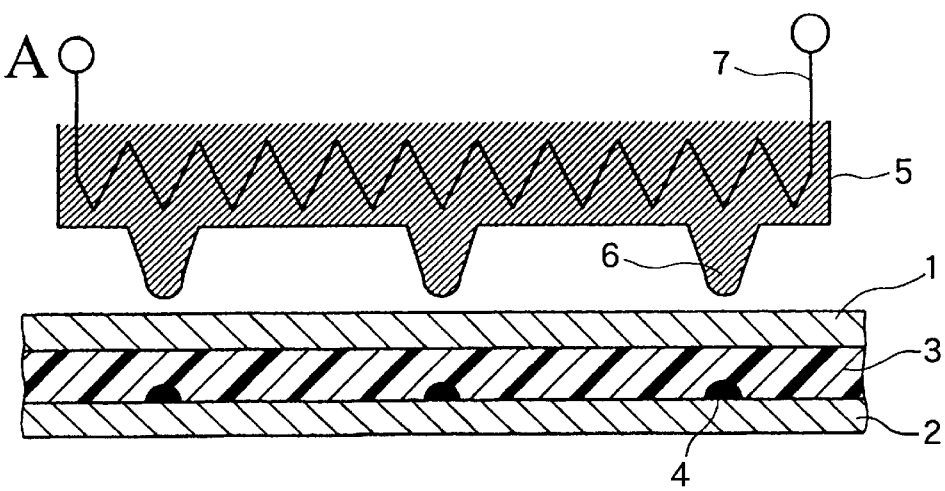
FIGS. 2A through 2D are sectional views exemplifying an interlayer connection structure in a circuit board according to the present invention by way of its first manufacturing process.
Figure 2B:
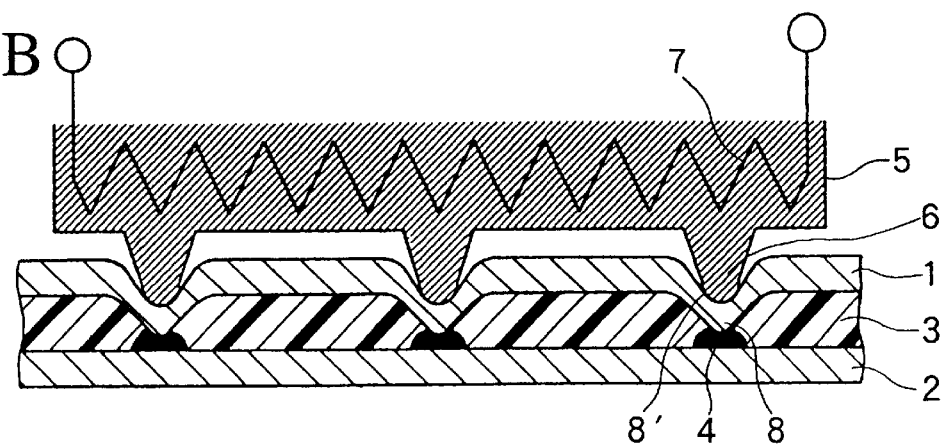

Then, as shown in FIG. 2B, this double surface copper clad lamination substrate is placed immediately under a pressure plate 5 having projections 6 corresponding to the positions where the conductive pastes 4 are applied. Then, this pressure plate 5 is pressed against the double surface copper clad lamination substrate while heating the pressure plate 5 by a heater 7.

Figure 2C:
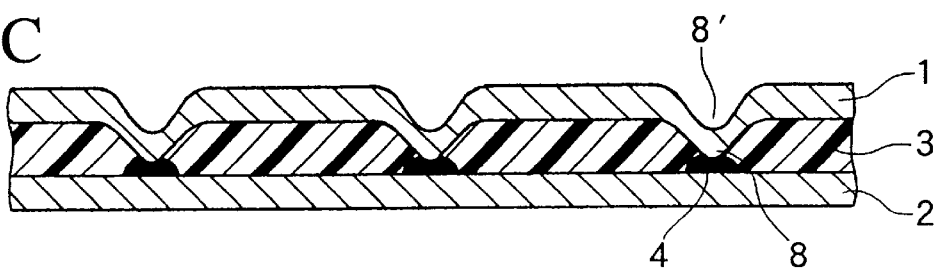

By doing so, as shown in FIG. 2C, the insulative sheet 3 is locally plasticized and melted. Simultaneously, the conductive paste 4 is softened or melded. At the same time, the copper foil 1 is locally deformed under the pressure of the projections 6, so as to be bent into the sheet 3. An apex of each projectingly bent portion 8 formed by this inwardly bending motion is brought into abutment with the copper foil 2. As a consequence, an electrical connection is established between the copper foil 1 and the copper foil 2 through the conductive paste 4. In this case, the conductive paste 4 absorbs irregularity in height of the projections 6 formed on the pressure plate 5 and irregularity in thickness of the insulative sheet 3. This means the conductive paste 4 functions as a means for ensuring an electrical connection between the copper foils 1 and 2.

Figure 2D:
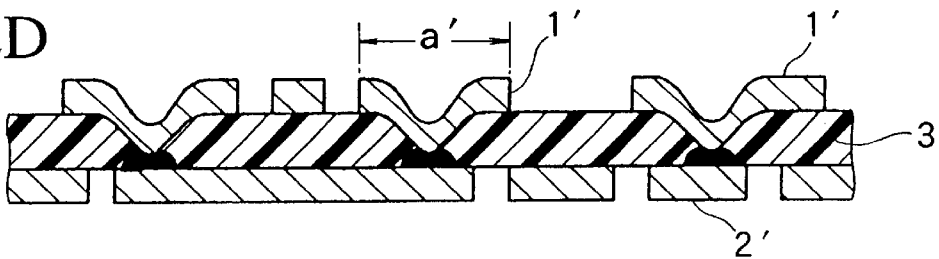

Since a recess 8' formed in the opposite side of each projectingly bent portion 8 of the copper foil 1 is very small in case the thickness of the insulative sheet 3 is so thin as 50 $\mu$m or less, a patterning is performed with respect to the copper foil by a photoetching process so that conductive circuit layers 1', 2' are formed as shown in FIG. 2D. By doing so, there can be obtained a double surface flexible circuit board in which an interlayer connection is established between a conductive circuit of the conductive circuit layer 1' and a conductive circuit of the other conductive circuit layer 2' by the projectingly bent portions 8.

Figure 1A:
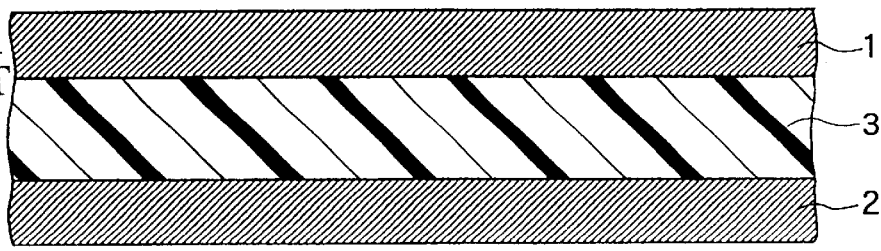
FIGS. 1A through 1D are sectional views showing a conventional interlayer connection structure in a circuit board by way of its manufacturing process.
Figure 1B:
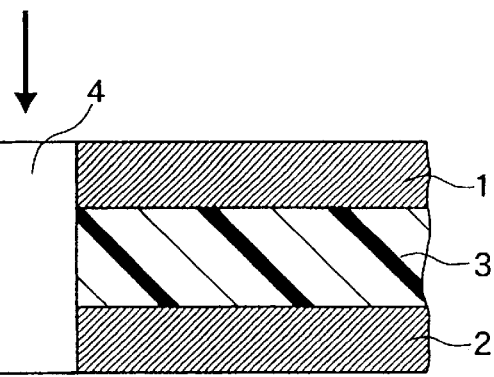
Figure 1C:
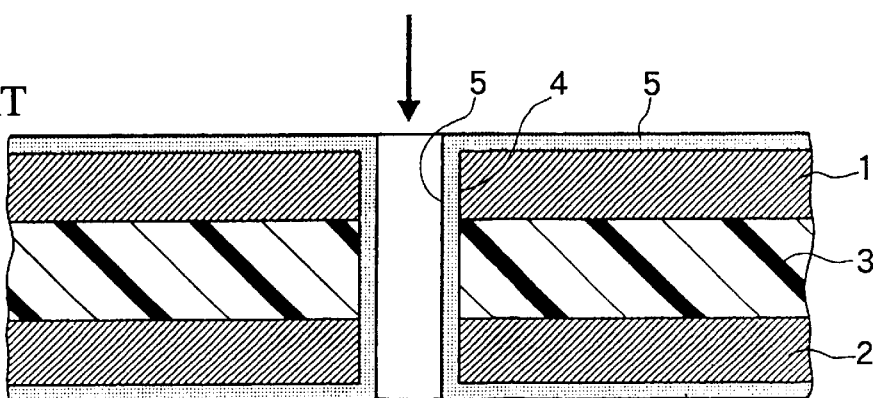
Figure 1D:
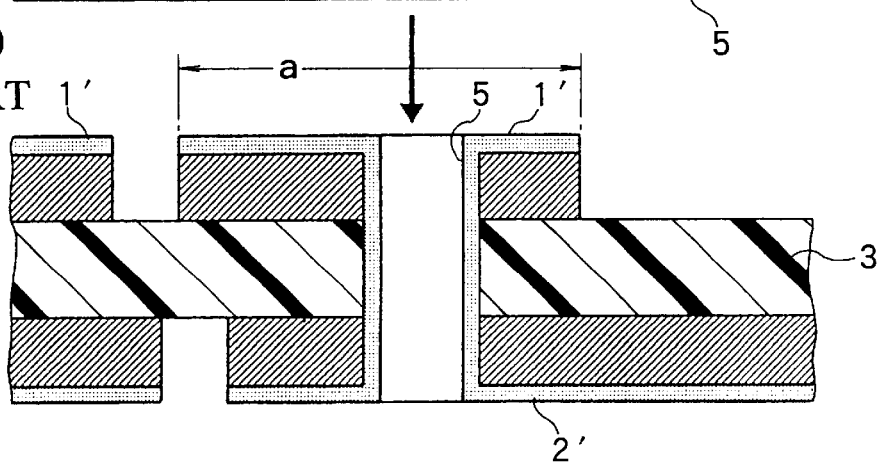

There are no through-holes formed in the copper foil 2 side and therefore, an electronic part can be mounted on each interlayer connection spot. Since each interconnection spot is very small, a fine pattern design can be realized. Moreover, since a land diameter a' of the interlayer connection spot of the conductive circuit layer 1' corresponding to the through-hole land diameter a of FIG. 1D can be made very small, a fine pattern design can be realized also with respect to the conductive circuit layer 1'.

Figure 3A:
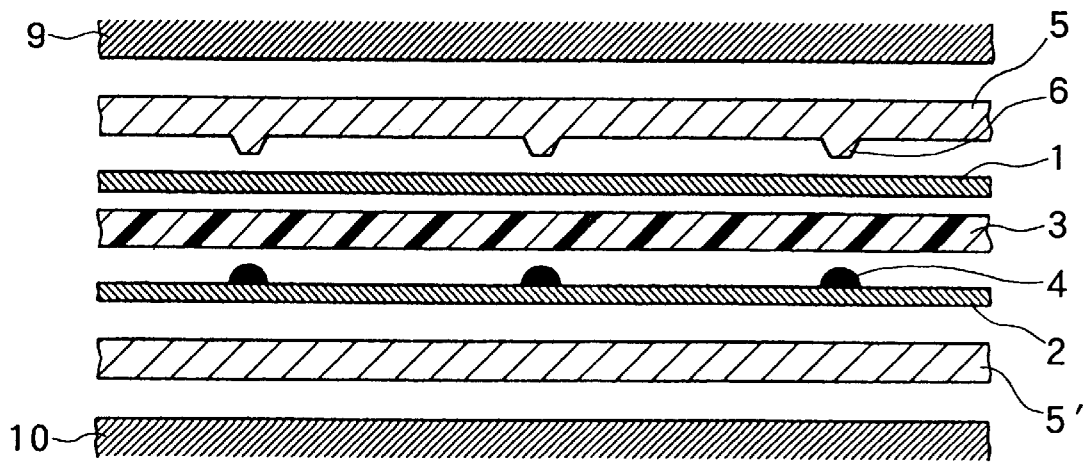
FIGS. 3A through 3C are sectional views exemplifying an interlayer connection structure in a circuit board according to the present invention by way of its second manufacturing process.
Figure 3B:
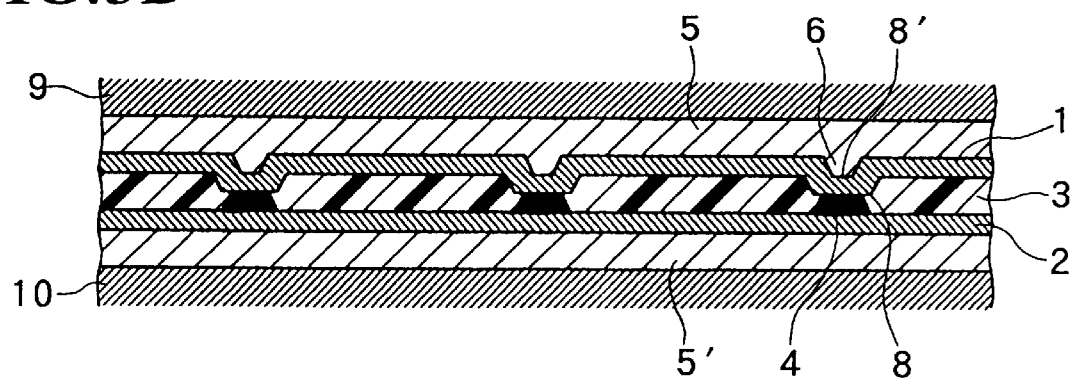

FIG. 3 is another example of the present invention. As shown in FIG. 3A, the copper foil 2 with the conductive pastes 4 located at predetermined positions by printing is placed on one surface of the thermoplastic insulative sheet 3 and the copper foil 1 is placed on the other surface. A flat stainless steel pressure plate 5' is disposed at an outer surface side of the copper foil 2, whereas a stainless steel pressure plate 5 having projections 6 is disposed at an outer surface side of the copper foil 1. Then, this entirety (3, 1, 2, 5, 5') is hot pressed by hot pressing hot plates 9, 10. That state is illustrated in FIG. 3B. In this case, the press bonding of the insulative sheet 3 to the copper foils 1, 2 by its plasticization, generation of the projectingly bent portions 8 due to hot melting of the conductive paste and local deformation of the copper foil 1, and interlayer connection between the copper foils 1 and 2 through the projectingly bent portions 8 are simultaneously performed.

Figure 3C:
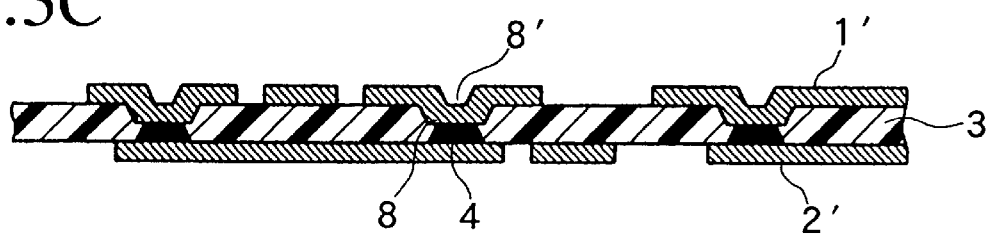

Then, when a patterning is applied to the copper foils 1, 2, the conductive circuit layers 1', 2' are formed on one and the other surfaces of the insulative sheet 3 as shown in FIG. 3C and as a result, an interlayer connection is established between the conductive circuits of the conductive circuit layers 1', 2'. This interlayer connection is firmly established by hot melting of the conductive pastes 4. Because the press bonding of the copper foils 1, 1 to the insulative sheet 3 and the interlayer connection are simultaneously performed in this manufacturing process, the insulative sheet 3 may be a thermosetting resin selected, for example, from epoxy group or the like.

As the conductive paste 4, there can be selected from those obtained by kneading nickel powder with a synthetic resin paste and by kneading copper powder with a synthetic resin paste. Also, a soldering paste obtained by kneading solder powder and a resin conductive paste obtained by kneading metal powder can be listed as acceptable paste for the conductive paste 4.

In the above embodiments, the conductive paste 4 is employed as a medium for connection. However, if the materials to be connected together are not required to be used under such severe conditions of use as bending for use a circuit board, or they are not required to be connected at many connection spots (therefore, a comparatively large connection area is available), the mother materials of copper foils may merely be bonded together under pressure. In other word, the present invention includes a case where the mother materials of the conductive circuit layers 1', 2' are directly bonded together under pressure through the projectingly bent portions 8.

It is already confirmed that a satisfactory electrical contact can be obtained merely by bonding under pressure the copper foils 1, 2 because the surfaces of the copper foils 1, 2 on the side of the insulative sheet 3 are rough.

Further, the entire bonding surface or the connection spots of the copper foil 1 or 2 may be solder plated so as to be used as a medium for fusing the projectingly bent portions 8. Also, in the above embodiments, a plurality of projectingly bent portions 8 are generated and connected at the same time. It is an interesting alternative that the projectingly bent portions 8 are formed, one by one, by a heated needle having a somewhat round tip.

As the thermoplastic insulative sheet, a liquid crystal polymeric material is most suited in realization of the present invention. It is important that when the copper foil 1 is deformed by the pressure of the heated projections 6, the sheet forming insulative material to be pushed away by the projections 6 is escaped to the periphery without fail and hardly remained in the connection spots. As one such acceptable insulative sheet 3, a liquid crystal polymer can be listed. It is excellent in flexibility and dimensional stability as a flexible circuit board, in particular. As concrete examples of the liquid crystal polymer, there can be listed a thermotropic liquid crystal ester and a thermotropic liquid crystal ester amide.

As a method for manufacturing a multilayer circuit board in accordance with an interlayer connection process of the present invention, any suitable conventional method may be employed such as an interlayer connection method in which a plurality of double face circuit boards are bonded together through a bonding sheet or the like and at the same time, the insulative sheet is penetrated by sharp conductive paste bumps formed on one of the conductive circuit layers so as to establish an electrical connection with the other conductive circuit layer, or a well-known through-hole plating method.

Aside from the method for easily realizing the pushing-in motion of the projections 6 and a generation of the projectingly bent portions 8 by locally plasticizing the insulative sheet 3 by means of the projections 6 as previously mentioned, there can be employed a method in which there is no necessity for softening by heating or fusing the insulative sheet 3, and the projectingly bent portions 8 are formed by the projections 6 which are pierced into the insulative sheet 3 so as to be abutted with the counterpart copper foil 2 (conductive circuit layer 2') or counterpart projectingly bent portions 8 which will be described hereinafter.

In the example of FIG. 4, the conductive circuit of the conductive circuit layer 1' disposed at one surface of the insulative sheet 3 and the conductive circuit of the conductive circuit layer 2' disposed at the other surface are bent inwardly of the insulative sheet 3 to form apexes of the projectingly bent portions 8, so that the apexes of the bent portions 8, 8 are in abutment with each other to thereby establish an interlayer connection.

Figure 4A:
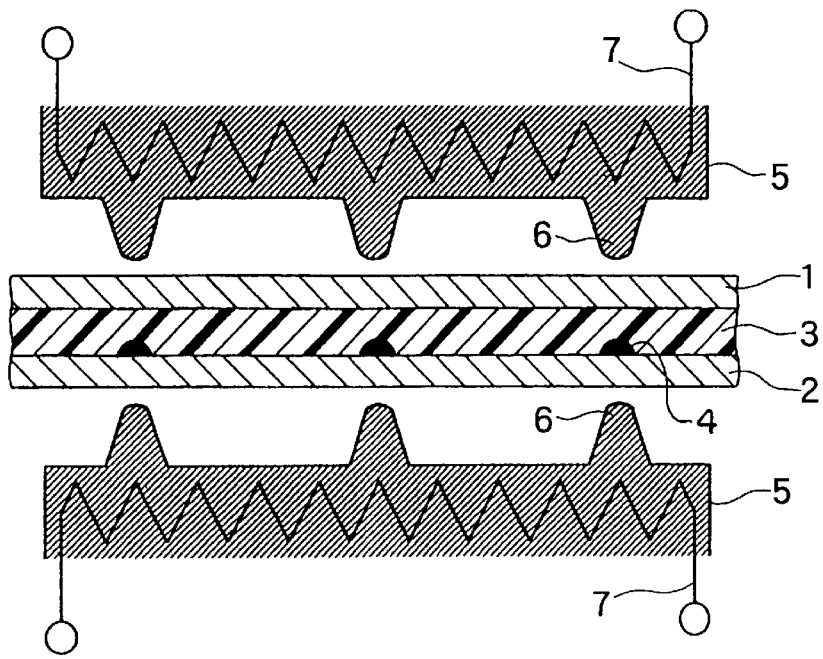
FIGS. 4A through 4D are sectional views exemplifying an interlayer connection structure in a circuit board according to the present invention by way of its third manufacturing process.

More specifically, as described previously with reference to FIG. 2, a double surface copper clad substrate is formed in which the copper foils 1, 2 are thermally bonded under pressure to one and the other surfaces of the flexible insulative sheet 3 made of a resin material having thermoplastic properties or the like as shown in FIG. 4A. A bonding surface of the copper foil 2 or 1 is provided at predetermined positions thereof with an appropriate quantity of conductive pastes 4 by printing. In the example shown in FIG. 4, there is no provision of the conductive pastes 4.

Figure 4B:
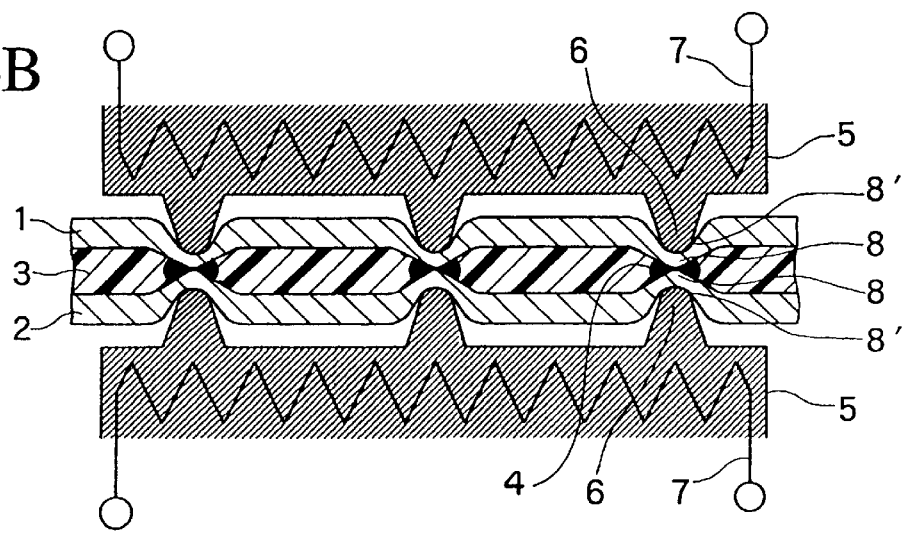

As shown in FIG. 4B, the double surface copper clad substrate thus obtained is placed between a pair of pressure plates 5 having projections 6 at positions corresponding to the positions where the conductive pastes 4 are arranged. This pair of pressure plates 5 are pressed against the double surface copper clad substrate while heating the pressure plates 5 by a heater 7.

Figure 4C:
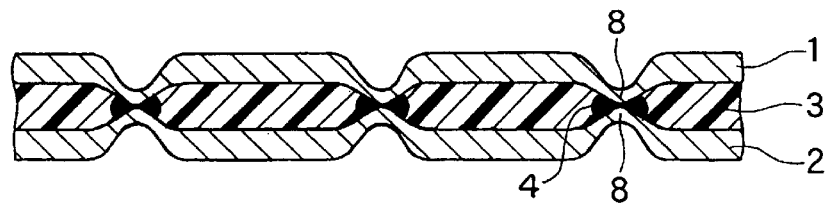

By doing so, as shown in FIG. 4C, the insulative sheet 3 is locally plasticized and melted. Simultaneously, the conductive paste 4 is softened or melded. At the same time, the copper foils 1, 2 are locally deformed under the pressure of the projections 6, so as to be bent into the sheet 3. An apex of each projectingly bent portion 8 formed by this inwardly bending motion is brought into abutment with the copper foil 2. As a consequence, an electrical connection is established between the copper foil 1 and the copper foil 2 through the conductive paste 4. In case, there is no provision of the conductive paste, the apexes of the projectingly bent portions 8 are directly bonded together under pressure.

Figure 4D:
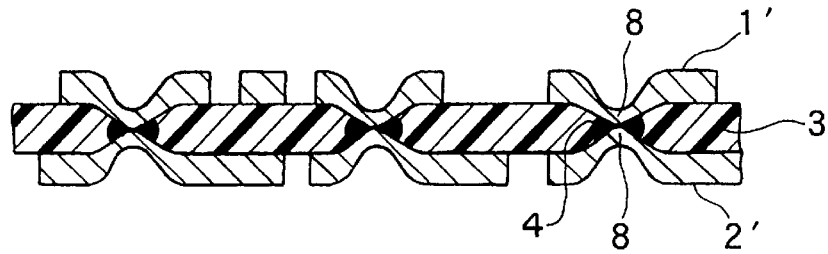

Since a recess 8' formed in the opposite side of each projectingly bent portion 8 of the copper foil 1 is very small in case the thickness of the insulative sheet 3 is so thin as 50 $\mu$m or less, a patterning is performed with respect to the copper foil by a photoetching process so that conductive circuit layers 1', 2' are formed as shown in FIG. 4D. By doing so, there can be obtained a double surface flexible circuit board in which an interlayer connection is established between a conductive circuit of the conductive circuit layer 1' and a conductive circuit of the other conductive circuit layer 2' by the projectingly bent portions 8.

The embodiment of FIG. 4 can likewise be practiced with respect to the embodiment shown in FIG. 3. In that case, the pressure plate 5' of FIG. 3 are provided with the projections 6 at corresponding positions as in the case with the pressure plate 5. When the copper foils on the opposite surfaces of the sheet 3 are brought into abutment with each other in this way, the degree of recession with respect to the copper foils 1, 2 can be reduced and therefore, a fine patterning can easily be applied to the copper foils 1, 2. Moreover, the interlayer connection portion lands (copper foil areas at the contact portions) can be reduced.

FIG. 5 shows another example. In this example, there are a provision of through-holes 11 at positions corresponding to the positions where the projectingly bent portions 8 are to be formed, and the bent portions 8 are bent into the through-holes 11. In case a conductive paste 4 is employed as a connecting medium, this is preliminarily printed on an inner surface of the copper foil 2 such that the conductive paste 4 are spacedly arranged within one opening of each through-hole 11.

Figure 5A:
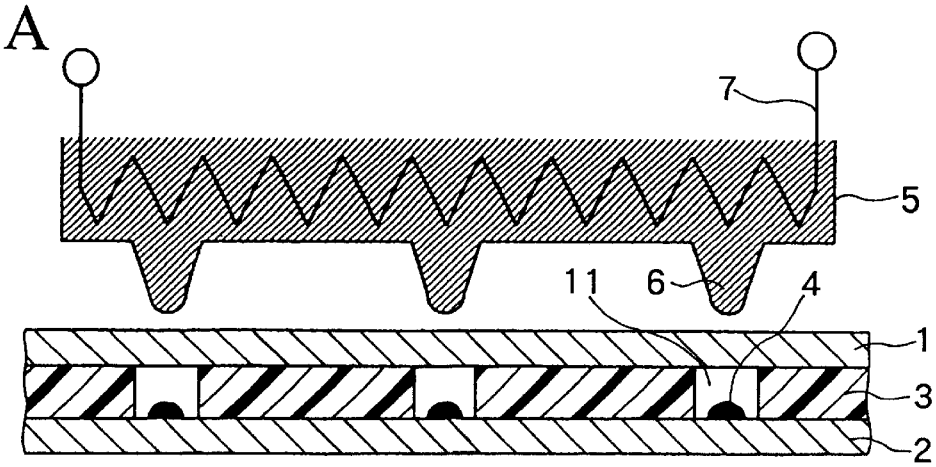
FIGS. 5A through 5D are sectional views exemplifying an interlayer connection structure in a circuit board according to the present invention by way of its fourth manufacturing process.

As shown in FIG. 5A, copper foils 1, 2 are thermally bonded under pressure to one and the other surface of a flexible insulative sheet 3 made of a thermoplastic resin material to thereby form a double surface copper clad lamination substrate. This insulative sheet 2 is provided at its predetermined positions with through-holes 11 and a bonding surface of the copper foil 2 or 1 is provided at predetermined positions thereof with an appropriate quantity of conductive pastes 4 by printing. This conductive paste 4 is arranged within one opening of each through-hole 11.

Figure 5B:
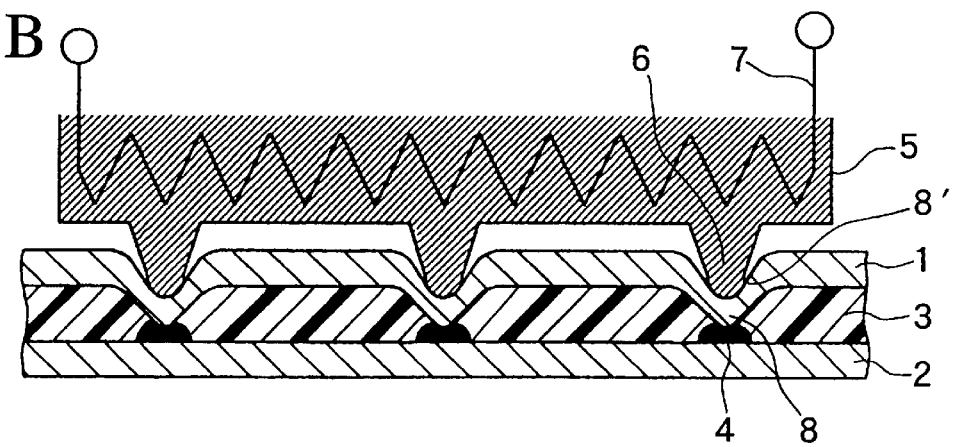

Then, as shown in FIG. 5B, this double surface copper clad lamination substrate is placed immediately under a pressure plate 5 having projections 6 corresponding to the positions where the conductive pastes 4 are applied. Then, this pressure plate 5 is pressed against the double surface copper clad lamination substrate while heating the pressure plate 5 by a heater 7.

Figure 5C:
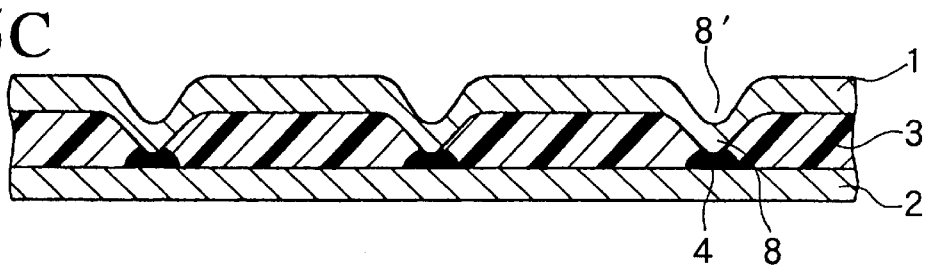

By doing so, as shown in FIG. 5C, the insulative sheet 3 is locally deformed and bent into the sheet 3 under the pressure of the projections 6. An apex of each projectingly bent portion 8 formed by this inwardly bending motion is brought into abutment with the copper foil 2 within each through-hole 11. As a consequence, an electrical connection is established between the copper foil 1 and the copper foil 2 through the conductive paste 4. At the same time, the insulative material (hole wall of the insulative sheet) within the through-holes 11 is softened and melted so as to be embedded. The embodiment of FIG. 5 is effective in case the insulative sheet 3 is formed of a material difficult to escape by deformation of the copper foil 1 or 2. More specifically, this embodiment is effective when a glass cloth contained epoxy sheet, an ordinary epoxy sheet, or the like is used as the insulative sheet 3.

Figure 5D:
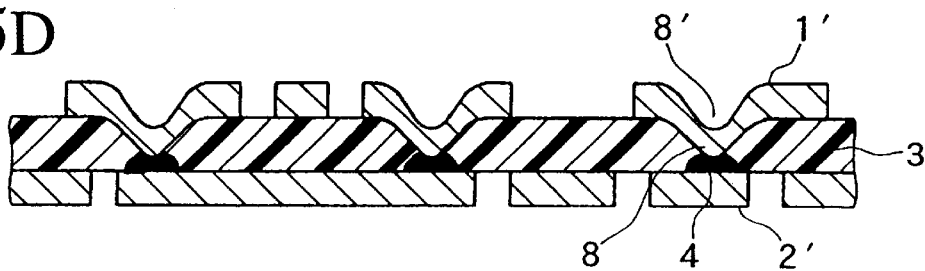

Then, as shown in FIG. 5D, a patterning is applied to the copper foils 1, 2 so that the conductive circuit layers 1', 2' are formed. By doing so, there can be obtained a double surface flexible circuit board or a rigid circuit board in which the conductive circuit of the conductive circuit layer 1' on one outer surface are interlayer connected to the conductive circuit of the other conductive circuit layer 2' at predetermined positions.

Next, another example of FIG. 6, which rather resemble the one shown in FIG. 3, will be described. As shown in FIG. 6A, a flat stainless steel pressure plate 5 is provided at its surface with projections 6a composed of insulative paste or conductive paste such as resin by printing. Then, the stainless steel pressure plate 5 having the insulative projections or conductive projections, the copper foil 1, the insulative sheet 1, the copper foil 2 having the conductive pastes 4 at predetermined positions, and the flat stainless pressure plate 5' are placed one upon another and thermally bonded together by hot pressing.

Figure 6B:
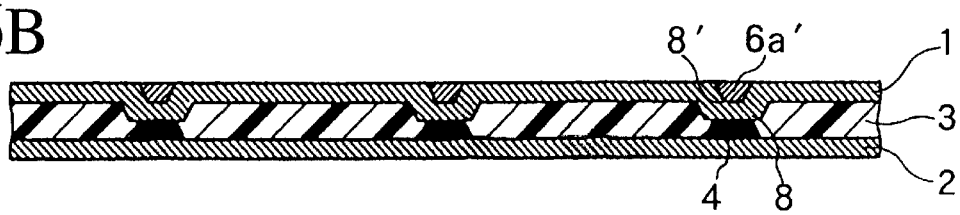

As a result, as shown in FIG. 6B, the copper foil 1 is locally bent into the sheet 3 to form the projectingly bent portions 8 by the projections 6a and the projections 6a are remained as being peeled off the stainless pressure plate 5 and embedded. That is, the projections 6a themselves are deformed while deforming the copper foil 1 by hot pressing, thus ensuring the pressure with respect to the copper foils 1, 2. When the stainless steel pressure plates 5, 5 are removed, the projections 6a are remained in their deformed states within the recesses 8' of the projectingly bent portions 8 of the copper foil 1, thus bearing the role for flattening the outer surface of the copper foil 1.

In this case, irregularity in height b of the projections 6a is absorbed by deformation of their top portions. As a consequence, a plurality of connection spots can simultaneously connected together with a favorable yield of production. Further, since the surface is flat, a photo resisting coating or a lamination of a photo resisting sheet can easily be made. In addition, since the copper foil portions of the projectingly bent portions 8 as the contact points are covered with the above insulative material or conductive material 6a', they are advantageously protected when the copper foils are being etched.

The projections 6a are formed on the stainless steel pressure plate 5 by printing every time a pressing operation is performed.

Figure 6C:
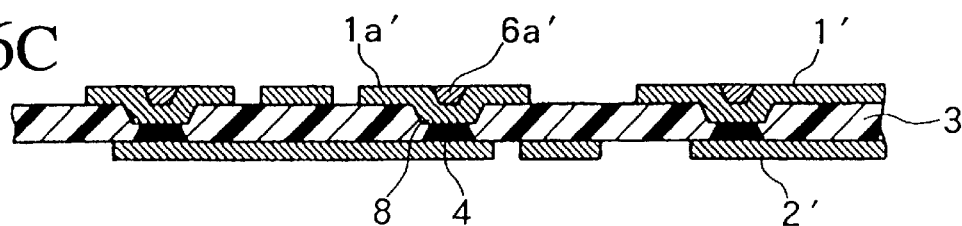

As shown in FIG. 6A', owing to a provision of the projections 6a of FIG. 6A formed on the outer surface of the copper foil 1, as shown in FIGS. 6B and 6C, the interior of each recess 8' can be filled with the insulative material or conductive material 6a'. The example of FIG. 6 can likewise be practiced with respect to the embodiments shown in FIGS. 4 and 5.

FIG. 7 shows another example, in which two single surface wiring circuit boards 12, 13 are interlayer connected together in accordance with the teaching of the present invention, and the circuit boards 12, 13 are integrally joined.

Specifically, as shown in FIGS. 7A and 7B, a circuit board 12 including an insulative sheet 3 formed of a thermoplastic resin material and having a conductive circuit layer formed at its surface, and a circuit board 13 including an insulative sheet 3', which is not necessarily required to have thermoplastic properties, having a conductive circuit layer 15 formed at its surface, are prepared. Then, one ends of the circuit boards 12, 13 are placed one upon the other such that the conductive circuit layer 14 is present on the upper surface side of the insulative sheet 3 and the conductive circuit layer 15 of the circuit board 13 is present on the lower surface side of the sheet 3.

The end portion of the conductive circuit layer 15 is provided on its surface with conductive pastes 4 by printing. Then, as shown in FIG. 7C, a thermally pressurizing device Sa having a projection 6 is pressed against the circuit board 12 from the surface of the conductive circuit layer 14, so that the insulative sheet 3 is plasticized and the conductive circuit layer 14 is locally bent into the sheet 3. Tops of the projectingly bent portions 8 thus formed are brought into abutment with the surfaces of the respective conductive circuits in the conductive circuit layer 15 so that an electrical connection is established. Because there is a provision of the conductive paste 4 at the abutment surface, the conductive paste 4 is softened or melted by heating by means of the projection 6 so that the projectingly bent portion 8 and the conductive circuit in the conductive circuit layer 15 are thermally bonded together, thus establishing a firm interlayer connection between the conductive circuit layers 14 and 15.

In FIG. 7, reference numerals 16, 17 denote protective layers for covering the surfaces of the conductive circuit layers 14, 15, respectively. The respective conductive circuit ends in the conductive circuit layers 14, 15 are exposed through the protective layers 16, 17 so as to be subjected to connection.

As the thermoplastic resin sheet 3, a liquid crystal polymer is suitably employed as previously mentioned. There may be a provision of a through-hole 11 extending through the insulative sheet 3 at an area where the projectingly bent portion 8 is formed, as previously mentioned with reference to FIG. 5.

In summary, FIG. 6 illustrates an interlayer connection structure in a circuit board in which the conductive circuit layer 14 disposed at one surface of the insulative sheet 3 is locally bent into the insulative sheet 3, and the top of each projectingly bent portion 8 formed by this bending is brought into abutment with the conductive circuit layer 15 disposed at the other surface of the insulative sheet 3, so that an interlayer connection is established therebetween. Instead of a provision of the conductive paste 4, an anisotropical conductive film may be interposed between the circuit boards 12 and 13. In this case, because of a provision of conductive particles mixed within the anisotropical film, the conductive circuits are electrically connected together at the portion where the conductive circuit layers 14, 15 are pressed.

The projectingly bent portions 8 formed in FIGS. 2 through 7 are formed, as shown in FIG. 8A, by linearly bending the short-wise entire width of each conductive circuit in the conductive circuit layer, or as shown in FIG. 8B, by dottingly bent into the insulative sheet 3 at an inner region of the conductive circuit.

As described hereinbefore, according to the present invention, merely by bending one conductive circuit layer into the insulative sheet without forming any holes in the conductive circuit layer, there can be established an interlayer connection with the other conductive circuit layer. As a consequence, the work required for interlayer connection can significantly be simplified and the cost can be reduced.

Furthermore, it can be applied to a circuit board having fine conductive circuits and a high degree of precision. Therefore, the device of the present invention can effectively fulfill the requirement for designing a circuit pattern in high density. Moreover, the conventional problems, as in the case where there is a provision of through-holes in the circuit board, for reducing the mounting density of electronic parts can effectively be obviated.

Although this invention has been described in its preferred form with a certain degree of particularity, it should be understood that the present disclosure of the preferred form has been made only by way of example and that numerous changes in the details of construction and arrangement of parts may be resorted to without departing from the spirit and the scope of the invention as hereinafter claimed.

What is claimed is:

1. A method of forming an interlayer connection structure between first and second conductors on opposite first and second surfaces of an apertureless insulative sheet, said method comprising:

providing a quantity of conductive paste or low-melting point metal between said insulative sheet and said second conductor and in contact with said second conductor; and forcibly plastically deforming a portion of said first conductor in a direction into said insulative sheet by forcibly pressing a projection directly against said first conductor, thereby forming a bent portion of said first conductor that projects into material of said insulative sheet while deforming said material and forcing said bent portion into said quantity of conductive paste or low-melting point metal, thus forming said interlayer connection structure.

2. A method as claimed in claim 1, wherein said deforming comprises forming said bent portion to have an apex that is forced into said quantity of conductive paste or low-melting point metal.

3. A method as claimed in claim 1, further comprising heating said projection and thereby locally plasticizing said material of said insulative sheet.

4. A method as claimed in claim 1, wherein said projection is a rigid member integral with a pressing plate.

5. A method as claimed in claim 1, wherein said first and second conductors comprise conductive circuit layers.

6. A method as claimed in claim 1, wherein said first and second conductors comprise foil layers.

7. A method as claimed in claim 1, wherein said material of said insulative sheet comprises thermoplastic resin, and said deforming of said material by said bent portion comprises locally plasticizing said material.

8. A method as claimed in claim 7, wherein said thermoplastic resin comprises a liquid crystal polymer.

9. A method as claimed in claim 1, wherein said forcibly plastically deforming comprises forming a plurality of bent portions that project into said material of said insulative sheet while forcing apices of said bent portions to project into plural respective quantities of conductive paste or low-melting point metal embedded in said insulative sheet and in contact with said second conductor.

10. A method as claimed in claim 1, comprising forming said bent portion to be dot-shaped.

11. A method as claimed in claim 1, wherein said deforming said portion of said first conductor forces said bent portion into said material of said insulative sheet and causes said material to be locally softened and melted.

12. A method as claimed in claim 1, wherein said first and second conductors are free of non-conductive material.

13. A method as claimed in claim 1, wherein said providing of a quantity of conductive paste or low-melting point metal comprises selectively depositing portions of said conductive paste or low-melting point metal at predetermined locations between said insulative sheet and said second conductor.

14. A method as claimed in claim 1, further comprising:

forming a first conductor comprising a first foil layer on a first surface of said apertureless insulative sheet, and forming a second conductor comprising a second foil layer on a second surface of said apertureless insulative sheet prior to said forcibly plastically deforming said portion of said first conductor; and photoetching said first foil layer and said second foil layer after said forcibly plastically deforming said portion of said first conductor so as to form conductive circuit layers on said first surface and said second surface of said apertureless insulative sheet.

\* \* \* \* \*